United States Patent
Kim

Patent Number: 6,133,141
Date of Patent: Oct. 17, 2000

[54] METHODS OF FORMING ELECTRICAL CONNECTIONS BETWEEN CONDUCTIVE LAYERS

[75] Inventor: Sung-Bong Kim, Kyungki-do, Rep. of Korea

[73] Assignee: Samsung Electronics Co., Ltd., Rep. of Korea

[21] Appl. No.: 09/238,384

[22] Filed: Jan. 27, 1999

Related U.S. Application Data

[63] Continuation of application No. 08/870,539, Jun. 6, 1997, abandoned.

[30] Foreign Application Priority Data

Aug. 8, 1996 [KR] Rep. of Korea ................. 96-33071

[51] Int. Cl.[7] ............................................. H01L 21/4763
[52] U.S. Cl. ..................... 438/624; 438/618; 438/622; 438/637; 438/638; 438/666; 438/668; 438/667; 438/672; 438/675
[58] Field of Search ........................ 438/618, 622, 438/624, 637, 638, 666, 668, 667, 672, 675

[56] References Cited

U.S. PATENT DOCUMENTS

| | | | |
|---|---|---|---|
| 4,944,682 | 7/1990 | Cronin et al. | 437/192 |
| 4,966,870 | 10/1990 | Barber et al. | 437/228 |
| 5,110,712 | 5/1992 | Kessler et al. | 430/312 |
| 5,291,058 | 3/1994 | Samata et al. | 257/641 |
| 5,347,100 | 9/1994 | Fukuda et al. | 219/121.43 |
| 5,451,543 | 9/1995 | Woo et al. | 437/195 |
| 5,461,004 | 10/1995 | Kim | 437/195 |
| 5,472,913 | 12/1995 | Havemann et al. | 437/195 |
| 5,565,384 | 10/1996 | Havemann | 437/228 |
| 5,578,523 | 11/1996 | Fiordalice et al. | 437/190 |

*Primary Examiner*—John F. Niebling
*Assistant Examiner*—David A. Zarneke
*Attorney, Agent, or Firm*—Myers Bigel Sibley & Sajovec

[57] ABSTRACT

Methods of forming electrical connections between conductive layers include the steps of forming a first electrically conductive layer on a substrate and then forming a first protective layer (e.g., $Si_3N_4$, poly-Si) which is resistant to a first etchant, on the first electrically conductive layer. A second protective layer (e.g., $SiO_2$) is then formed on the first protective layer. The second protective layer is preferably resistant to a second etchant which is capable of etching the first protective layer. A mask is then patterned on the second protective layer. The mask is preferably patterned to have an opening therein which extends opposite the first electrically conductive layer. The second protective layer is then selectively etched using the first etchant, to expose a portion of the first protective layer extending opposite the first electrically conductive layer. The exposed portion of the first protective layer is then etched using the second etchant, to define a contact hole which exposes a portion of the first electrically conductive layer. A second electrically conductive layer is then formed in the contact hole, on the exposed portion of the first electrically conductive layer and in ohmic contact therewith.

9 Claims, 7 Drawing Sheets

METHODS OF FORMING ELECTRICAL CONNECTIONS BETWEEN CONDUCTIVE LAYERS

This application is a continuation of application Ser. No. 08/870,539 filed Jun. 6, 1997, now abandoned.

FIELD OF THE INVENTION

The present invention relates to methods of forming electronic devices, and more particularly to methods of forming electrical connections between conductive layers on substrates.

BACKGROUND OF THE INVENTION

Recently, as semiconductor integrated circuits have become highly integrated, the sizes of discrete elements therein have been reduced. Thus, the lengths and widths of metal or poly-Si wiring interconnects have also been reduced. As will be understood by those skilled in the art, in order to achieve high integration densities, multi-layer wiring interconnects are typically required and these interconnect structures include interlayer electrical connections to ohmically connect multiple levels of wiring together.

FIGS. 1A–1B are cross-sectional views of intermediate structures illustrating a method of forming electrical interconnections between conductive layers, according to the prior art. Referring now to FIGS. 1A–1B, in order to connect a lower conductive layer 101 with an upper conductive layer 105 which is separated therefrom by an insulating layer 102, a mask 103 having openings therein is typically formed by patterning a layer of photoresist. Then, an anisotropic etching step is performed on the exposed portions of the insulating layer 102 using the mask 103 as an anti-etching film, until the lower conductive layer 101 is exposed. Thereafter, the upper conductive layer 105 is deposited in the contact window 104 formed during the etching step. In the event the contact window 104 is formed in accordance with the above described steps, a misalignment error can be generated where the contact window 104 is not exactly aligned opposite the lower conductive layer 101. Moreover, the insulating layer 102 may also be partially over-etched. To compensate for these potential problems, an overlap margin (region "B" in FIGS. 1B and 2) should be formed on the insulating layer 102. Further, the lower conductive layer 101 pattern corresponding to a portion over which the contact window 104 is formed, should be larger than the width of the contact window 104.

FIG. 2 is a layout schematic view of a plurality of conductive layers having contact holes therein, according to the prior art. In FIG. 2, reference "A" represents the size of the contact window 104, reference "C" represents the space between the wiring, and reference "D" represents the wiring pitch. As illustrated by FIGS. 2–3, even if the width of the wiring is reduced (see reference "E" in FIG. 3), the space between the wiring (see reference "F" in FIG. 3), and the size of the contact window 104 should be maintained so that there exists a degree of overlap margin (see reference "G" in FIG. 3). For that reason, the wiring pitch (see reference "H") is not greatly reduced relative to the wiring pitch "D" illustrated by FIG. 2. Therefore, the width of the entire layout is typically not reduced substantially.

Accordingly, as shown in FIG. 4, in the event a method for reducing the area includes arranging the contact holes 104 in a staggered sequence to reduce the overall area required by the wiring interconnects, the area of the layout can be substantially greatly reduced relative to the layout of FIG. 2. Unfortunately, there is a limitation in that the width of the overlap margin "I" typically cannot be substantially reduced.

Thus, notwithstanding the above described methods, there continues to be a need for improved methods of forming electrical connections between conductive layers.

SUMMARY OF THE INVENTION

It is therefore an object of the present invention to provide methods of forming electrical connections between conductive layers which require reduced layout area.

It is a further object of the present invention to provide methods of forming electrical connections between conductive layers which have reduced contact overlap margin.

These and other objects, features and advantages are provided by methods of forming electrical connections between conductive layers which include the steps of forming a first electrically conductive layer on a substrate and then forming a first protective layer (e.g., $Si_3N_4$, poly-Si) which is resistant to a first etchant, on the first electrically conductive layer. A second protective layer (e.g., $SiO_2$) is then formed on the first protective layer. The second protective layer is preferably resistant to a second etchant which is capable of etching the first protective layer. A mask is then patterned on the second protective layer. The mask is preferably patterned to have an opening therein which extends opposite the first electrically conductive layer. The second protective layer is then selectively etched using the first etchant, to expose a portion of the first protective layer extending opposite the first electrically conductive layer. The exposed portion of the first protective layer is then etched using the second etchant, to define a contact hole which exposes a portion of the first electrically conductive layer. A second electrically conductive layer is then formed in the contact hole, on the exposed portion of the first electrically conductive layer and in ohmic contact therewith.

DESCRIPTION OF PREFERRED EMBODIMENTS

Figure 1A:
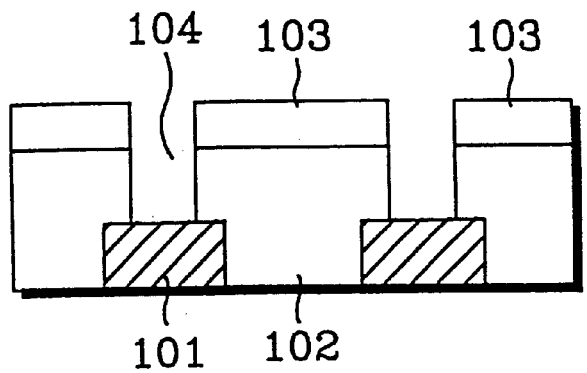
FIGS. 1A–1B are cross-sectional views of intermediate structures illustrating a method of forming an electrical connection between conductive layers according to the prior art.
Figure 1B:
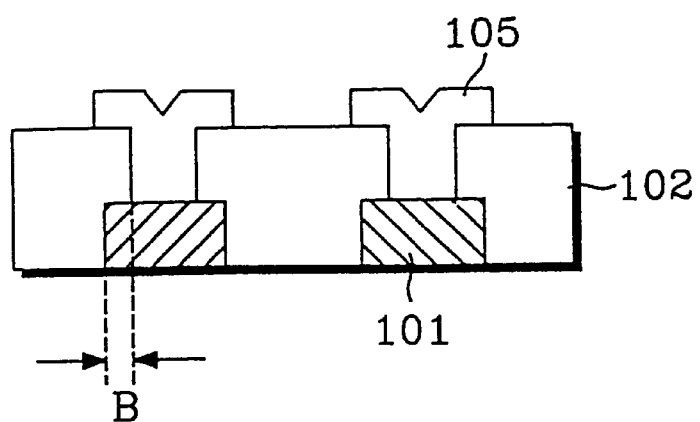
Figure 2:
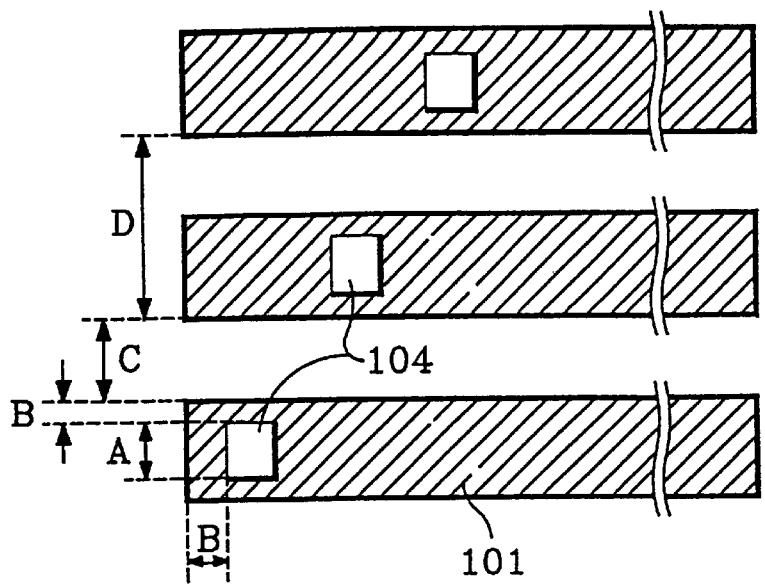
FIG. 2 is a layout schematic view of a plurality of conductive layers having contact holes therein, according to the prior art.
Figure 3:
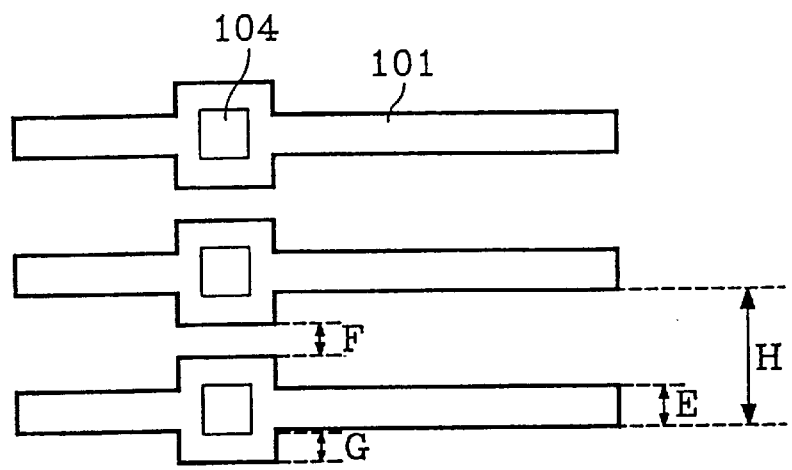
FIG. 3 is a layout schematic view of a plurality of conductive layers having enlarged contact areas and contact holes in the contact areas, according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 5A:
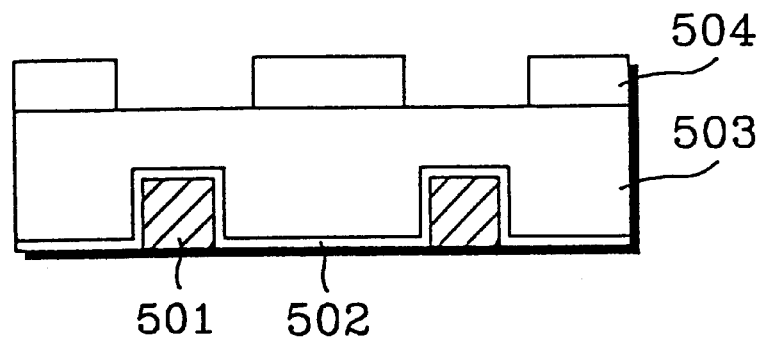
FIGS. 5A–5D are cross-sectional views of intermediate structures illustrating a method of forming an electrical connection between conductive layers according to a first embodiment of the present invention.

Referring now to FIGS. 5A–5D, a method of forming an electrical connection between conductive layers according to a first embodiment of the present invention will be described. In particular, FIG. 5A illustrates the step of forming a plurality of first electrically conductive layers 501 on a substrate. For example, the first conductive layers 501 may be formed on a face of a semiconductor substrate and in contact therewith and/or on field oxide isolation regions, using conventional techniques. The first conductive layers 501 may also be formed by depositing a blanket layer of metallization and then patterning the blanket layer as a plurality of separate metal lines. The first conductive layers 501 may also comprise semiconductor regions of predetermined conductivity type (e.g., diffusion regions) in a semiconductor substrate. A blanket first protective layer 502 is then formed on the first conductive layers 501. This first protective layer 502 may comprise polycrystalline silicon, silicon nitride, or other material which can resist at least some conventional processing etchants. A second protective layer 503 is then formed on the first protective layer 502. This second protective layer 503 may comprise silicon dioxide, for example, or other material which can resist at least some conventional processing etchants. A layer of photoresist may then be deposited on the second protective layer 503 and then patterned to define a mask 504 having openings therein which extend opposite the first electrically conductive layer 501, as illustrated in transverse cross-section in FIG. 5A.

Figure 5B:
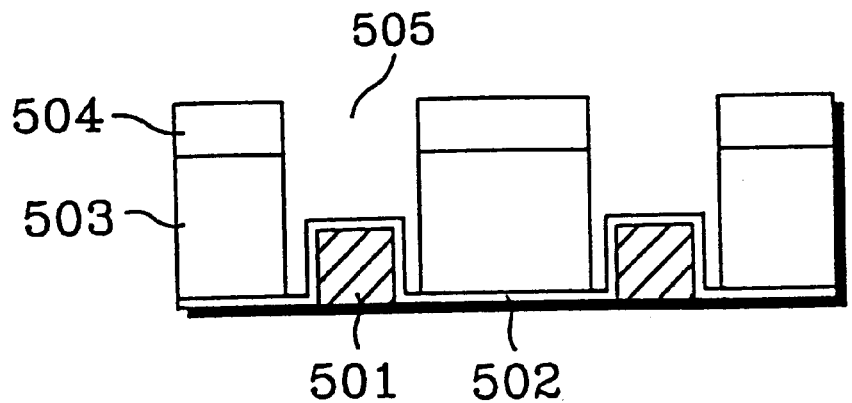
Figure 5C:
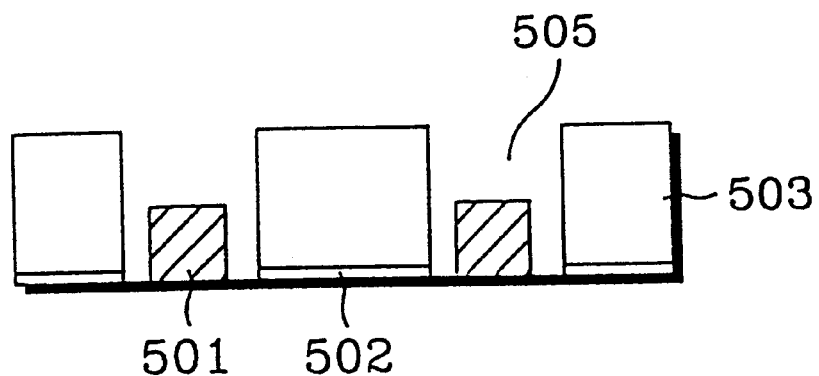

As illustrated best by FIG. 5B, contact windows 505 are then formed in the second protective layer 503 by etching the second protective layer 503 using the mask as an etching mask and an etchant which selectively etches the second protective layer 503 (e.g., $SiO_2$) but not the first protective layer 502 (e.g., $Si_3N_4$, poly-Si). According to this first embodiment, the contact windows 505 are wider in transverse cross-section than the first electrically conductive layers 501. Referring now to FIG. 5C, the exposed portions of the first protective layer 502 are then etched to expose the first conductive layers 501, using an etchant which selectively etches the first protective layer 502 but not the second protective layer 503. Using conventional techniques, a plurality of second electrically conductive layers 506 are then formed in the contact windows 505, in ohmic contact with respective first conductive layers 501, as illustrated best by FIG. 5D.

Figure 4:
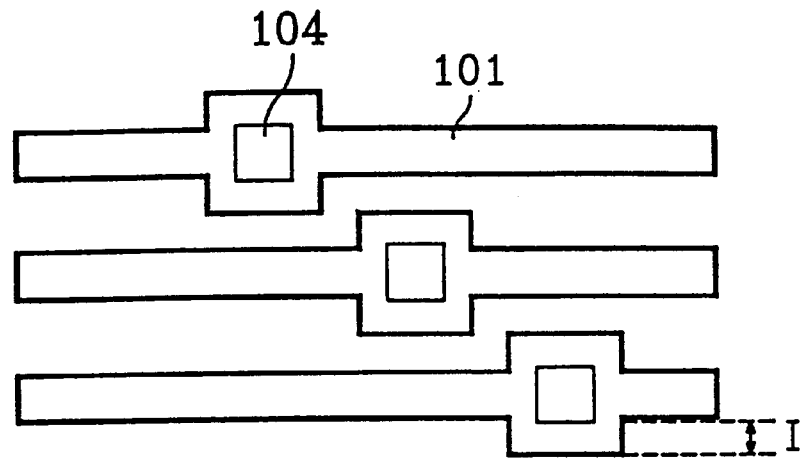
FIG. 4 is a layout schematic view of a plurality of conductive layers having enlarged contact areas arranged in a staggered sequence and contact holes in the contact areas, according to the prior art.
Figure 5D:
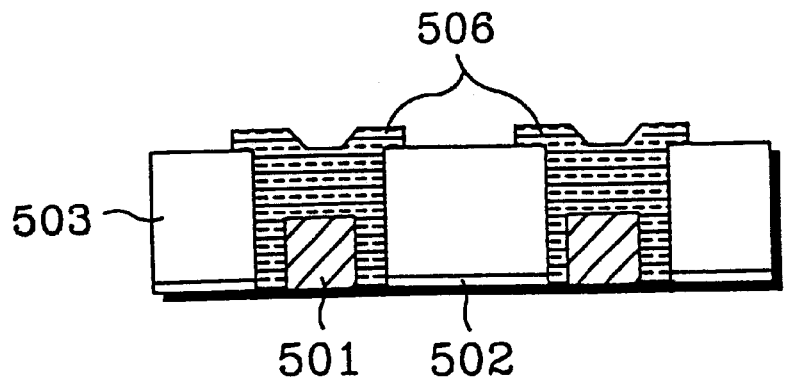
Figure 6:
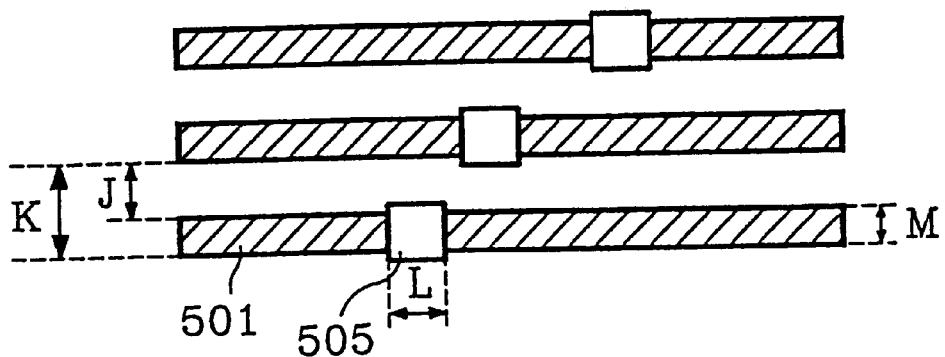
FIG. 6 is a layout schematic view of a substrate containing a plurality of conductive layers thereon and contact holes which expose the conductive layers, according to FIG. 5D.

Referring now to FIG. 6, a layout schematic view of the structure of FIG. 5D is illustrated. In particular, a plurality of first electrically conductive layers 501 are illustrated having a width "M". The spacing between adjacent layers 501 is defined as "J" and the wiring pitch is "K". The square contact windows 505 are also illustrated as having a width "L" which is greater than the width "M" of the conductive layers 501. Accordingly, the method of the present invention prevents an upper conductive layer 506 from being short-circuited with a another conductive layer passing through the lower portion of the lower conductive layer 501. If the conductive layers made by the above process are arranged in a staggered sequence as shown in FIG. 6, the overlap margin is even more reduced than that of the layout described in FIG. 4 and therefor the interval "J" between conductive layers is reduced. For that reason, the pitch "K" is reduced and an increase in wiring integration can be achieved.

Figure 7A:
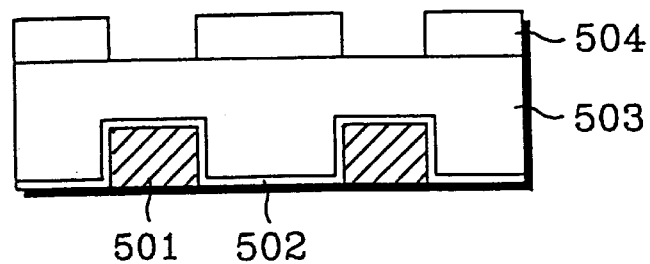
FIGS. 7A–7D are cross-sectional views of intermediate structures illustrating a method of forming an electrical connection between conductive layers according to a second embodiment of the present invention.

Referring now to FIGS. 7A–7D, a method of forming an electrical connection between conductive layers according to a second embodiment of the present invention will be described. In particular, FIG. 7A illustrates the step of forming a plurality of first electrically conductive layers 501 on a substrate. A blanket first protective layer 502 is then formed on the first conductive layers 501. This first protective layer 502 may comprise polycrystalline silicon, silicon nitride, or other material which can resist at least some conventional processing etchants. A second protective layer 503 is then formed on the first protective layer 502. This second protective layer 503 may comprise silicon dioxide, for example, or other material which can resist at least some conventional processing etchants. A layer of photoresist may then be deposited on the second protective layer 503 and then patterned to define a mask 504 having openings therein which extend opposite the first electrically conductive layer 501, as illustrated in transverse cross-section in FIG. 7A.

Figure 7B:
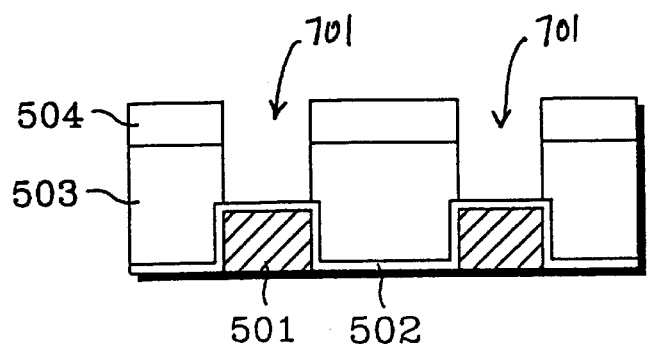
Figure 7C:
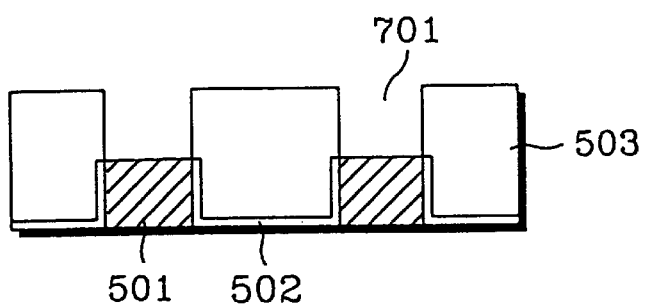

As illustrated best by FIG. 7B, contact windows 701 are then formed in the second protective layer 503 by etching the second protective layer 503 using the mask 504 as an etching mask and an etchant which selectively etches the second protective layer 503 (e.g., $SiO_2$) but not the first protective layer 502 (e.g., $Si_3N_4$, poly-Si). According to this second embodiment, the contact windows 701 are about equal in transverse cross-section to the first electrically conductive layers 501. Referring now to FIG. 7C, the exposed portions of the first protective layer 502 are then etched to expose the first conductive layers 501, using an etchant which selectively etches the first protective layer 502 but not the second protective layer 503. Using conventional techniques, a plurality of second electrically conductive layers 702 are then formed in the contact windows 701, in ohmic contact with respective first conductive layers 501, as illustrated best by FIG. 7D.

Figure 7D:
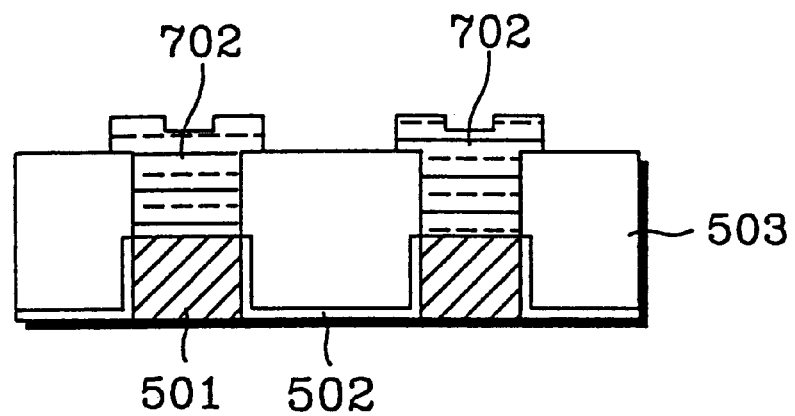
Figure 8:
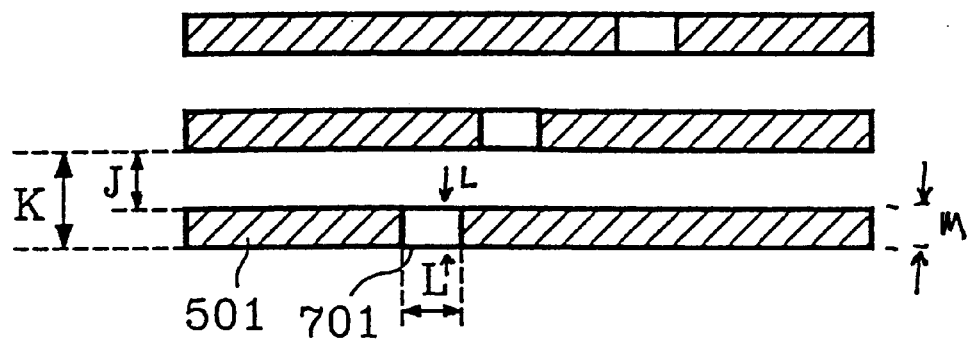
FIG. 8 is a layout schematic view of a substrate containing a plurality of conductive layers thereon and contact holes which expose the conductive layers, according to FIG. 7D.

Referring now to FIG. 8, a layout schematic view of the structure of FIG. 7D is illustrated. In particular, a plurality of first electrically conductive layers 501 are illustrated having a width "M". The spacing between adjacent layers 501 is defined as "J" and the wiring pitch is "K". The contact windows 701 are also illustrated as having a width "L" which is equal to the width "M" of the conductive layers 501. Accordingly, the method of the present invention prevents an upper conductive layer 702 from being short-circuited with another conductive layer passing through the lower portion of the lower conductive layer 501.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electrical connection between conductive layers, comprising the steps of:

forming a first electrically conductive layer on a substrate;

forming a first protective layer which is resistant to a first etchant on the first electrically conductive layer;

forming a second protective layer which is resistant to a second etchant different from the first etchant, on the first protective layer;

patterning a mask on the second protective layer so that the mask has an opening therein extending opposite the first electrically conductive layer;

selectively etching the second protective layer in the opening in the mask using the first etchant, to expose a portion of the first protective layer;

selectively etching the exposed portion of the first protective layer using the second etchant, to define a contact hole therein which exposes a portion of an upper surface and sidewalls of the first electrically conductive layer; and forming a second electrically conductive layer in the contact hole, on the exposed portion of the upper surface and sidewalls of the first electrically conductive layer.

2. The method of claim 1, wherein said step of forming a first protective layer comprises forming a first protective layer comprising a material selected from the group consisting of polycrystalline silicon and silicon nitride, on the first electrically conductive layer; and wherein said step of forming a second protective layer comprises forming a second protective layer comprising silicon dioxide, on the first protective layer.

3. The method of claim 2, wherein said step of forming a first electrically conductive layer comprises forming a first layer of metallization on a substrate.

4. A method of forming an electrical connection between conductive layers, comprising the steps of:

forming a first electrically conductive layer at a face of a substrate;

forming a first protective layer which is resistant to a first etchant, on an upper surface of the first electrically conductive layer extending opposite the face;

forming a second protective layer which is resistant to a second etchant different from the first etchant, on an upper surface of the first protective layer extending opposite the upper surface of the first electrically conductive layer;

etching a portion of the second protective layer using the first etchant, to expose a portion of the first protective layer;

etching the exposed portion of the first protective layer using the second etchant, to define a contact hole therein which exposes a portion of an upper surface and sidewalls of the first electrically conductive layer; and forming a second electrically conductive layer in the contact hole, in ohmic contact with the exposed portion of the upper surface and sidewalls of the first electrically conductive layer.

5. The method of claim 4, wherein the first protective layer comprises a material selected from the group consisting of polycrystalline silicon and silicon nitride; and wherein the second protective layer comprises silicon dioxide.

6. The method of claim 5, wherein said step of forming a first electrically conductive layer comprises forming a first layer of metallization on a face of a substrate.

7. A method of forming an electrical connection between conductive layers, comprising the steps of:

forming a first electrically conductive layer on a substrate;

forming a first protective layer which is resistant to a first etchant, on the first electrically conductive layer;

forming a second protective layer, on the first protective layer;

patterning a mask on the second protective layer so that the mask has an opening therein extending opposite the first electrically conductive layer;

selectively etching the second protective layer in the opening in the mask using the first etchant, to expose a portion of the first protective layer;

etching the exposed portion of the first protective layer to define a contact hole therein which exposes a portion of an upper surface and sidewalls of the first electrically conductive layer; and forming a second electrically conductive layer in the contact hole, on the exposed portion of the upper surface and sidewalls of the first electrically conductive layer.

8. The method of claim 7, wherein said step of forming a first protective layer comprises forming a first protective layer comprising a material selected from the group consisting of polycrystalline silicon and silicon nitride, on the first electrically conductive layer; and wherein said step of forming a second protective layer comprises forming a second protective layer comprising silicon dioxide, on the first protective layer.

9. The method of claim 8, wherein said step of forming a first electrically conductive layer comprises forming a first layer of metallization on a substrate.

* * * * *